(12) United States Patent
Kamins

(10) Patent No.: US 7,389,014 B2
(45) Date of Patent: Jun. 17, 2008

(54) INTEGRATED SEMICONDUCTOR CIRCUITS AND METHODS OF MAKING INTEGRATED SEMICONDUCTOR CIRCUITS

(75) Inventor: Theodore I Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 27 days.

(21) Appl. No.: 11/393,845

(22) Filed: Mar. 31, 2006

(65) Prior Publication Data

US 2007/0228459 A1 Oct. 4, 2007

(51) Int. Cl.
*G02B 6/12* (2006.01)
*H01L 21/00* (2006.01)
*H01L 33/00* (2006.01)
*B31D 3/00* (2006.01)

(52) U.S. Cl. .................. 385/14; 385/131; 438/29; 438/31; 216/56; 257/98; 257/99; 257/103

(58) Field of Classification Search .................. 385/14, 385/131, 132, 141; 438/29, 31, 745, 752, 438/753, 733; 216/33, 56; 257/98, 99, 103, 257/116, 117, 118, 618, 622
See application file for complete search history.

(56) References Cited

U.S. PATENT DOCUMENTS

| 4,802,951 A * | 2/1989 | Clark et al. ............. 216/56 |
| 6,706,204 B2 * | 3/2004 | Roitman et al. .......... 216/33 |
| 2003/0111440 A1 * | 6/2003 | Roitman et al. .......... 216/33 |
| 2004/0213307 A1 * | 10/2004 | Lieber et al. ............ 372/39 |
| 2005/0238288 A1 * | 10/2005 | Crutchfield ............. 385/50 |

OTHER PUBLICATIONS

S. Sharma, T.I. Kamins and R. Stanley Williams, "Diameter control of Ti-catalyzed silicon nanowires," J. Crystal Growth, vol. 267, pp. 613-618 (2004).
D. W. Wang, et al., "Low-Temperature Synthesis of Single-Crystal Germanium Nanowires by Chemical Vapor Deposition," Chem. Int. Ed., vol. 41, pp. 4783-4786 (2002).
T. I. Kamins, et al., "Growth and Structure of Chemically Vapor Deposited Ge Nanowires on Si Substrates," Nano Lett., vol. 4, No. 3, pp. 503-506 (2004).
B. J. Ohlsson, et al., "Size-, shape-, and position-controlled GaAs nano-whiskers," Appl. Phys. Lett., vol. 79, No. 20, pp. 3335-3337 (2001).
M. H. Huang, et al., "Room-Temperature Ultraviolet Nanowire Nanolasers," Science, vol. 292, pp. 1897-1899 (2001).
S. S. Yi, "InP Nanobridges Epitaxially Formed Between Two Vertical Si Surfaces" (unpublished).
M. T. Bjork, et al., "One-dimensional Steeplechase for Electrons Realized," Nano Lett., vol. 2, No. 2, pp. 87-89 (2002).
Zuoming Zhao et al—"Selective Epitaxy of III-V Semiconductor on Si Substrates Patterned by Diblock Copolymer"—2006 APS March Meeting.

* cited by examiner

*Primary Examiner*—Brian M Healy

(57) ABSTRACT

An integrated semiconductor circuit includes a substrate having a surface of a first semiconductor material, at least one separating material formed on the surface and defining a through hole, and a guide region formed in the hole. The guide region comprises at least one second semiconductor material. The guide region comprises at least a first region and a second region having a larger cross-section than the first region. The first region contacts the surface of the substrate over a small contact region. Methods of making the integrated semiconductor circuit are also disclosed.

22 Claims, 5 Drawing Sheets

INTEGRATED SEMICONDUCTOR CIRCUITS AND METHODS OF MAKING INTEGRATED SEMICONDUCTOR CIRCUITS

BACKGROUND

Silicon is one semiconductor material that has desirable electronic properties for use in electronic devices. However, silicon, like other elemental semiconductor materials, has poor light conversion properties, making it generally less desirable for use in optoelectronic or photonic applications. In contrast, certain compound semiconductor materials, can efficiently convert electrical energy to light energy, making such materials desirable for optoelectronics and photonics applications, but are difficult to use for complex and inexpensive electronics. There are also certain compound semiconductor materials that are used to modulate light with an electrical signal. In addition, there are elemental semiconductor materials in addition to silicon, as well as compound semiconductor materials, that can be used to detect light. Accordingly, in light of the respective advantages provided by different semiconductor materials, it would be desirable to be able to fabricate an integrated semiconductor circuit including different semiconductor materials and which exhibits desirable properties of the different semiconductor materials in a single integrated semiconductor circuit.

SUMMARY

An exemplary embodiment of an integrated semiconductor circuit comprises a substrate having a surface of a first semiconductor material; at least one separating material layer formed on the surface of the substrate, the at least one separating material layer defining a through hole extending to the surface; and a guide region comprising at least one second semiconductor material, the guide region including at least a first region formed in a first portion of the hole and a second region formed in a second portion of the hole, the first region contacting the surface of the substrate over a contact region having a maximum width of about 5 nm to about 50 nm, and the second region having a larger cross-section than the first region.

An exemplary embodiment of a method of making an integrated semiconductor circuit comprises forming at least one separating material layer on a surface of a substrate, the surface being of a first semiconductor material; forming a through hole in the at least one separating material layer extending to the surface of the substrate, the hole including at least a first portion overlying the surface and a second portion having a larger cross-section than the first portion; and forming at least one second semiconductor material in the hole to form a guide region, the guide region including a first region in the first portion of the hole and a second region in the second portion of the hole, the first region contacting the surface of the substrate over a contact region having a maximum width of about 5 nm to about 50 nm, and the second region having a larger cross-section than the first region.

DETAILED DESCRIPTION

Figure 1:
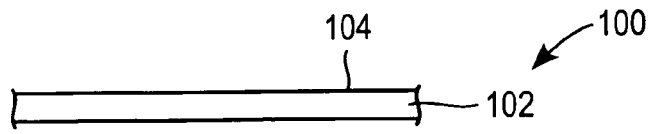
FIG. 1 illustrates a substrate of an exemplary embodiment of an integrated semiconductor circuit.

In integrated semiconductor circuits, as well as other device applications, there is a desire to integrate different semiconductor materials with each other to utilize attractive properties of the different semiconductor materials in a single circuit. For example, silicon is an excellent electronic material. It can be used, for example, to carry electrical signals, or as a waveguide for carrying light signals (e.g., infrared light having the 1.55 micron communication wavelength). However, silicon is an indirect bandgap material and so energy released during the recombination of electrons with holes is converted primarily into phonons, making silicon inefficient for light conversion. Other elemental semiconductors also have poor light conversion properties.

In contrast, certain compound semiconductor materials have a direct bandgap and so energy released during the recombination of electrons with holes is converted primarily into radiation in such materials. Consequently, these compound semiconductor materials can convert electrical energy to light energy efficiently. Compound semiconductor materials can be used as light emitters for photonic applications or as light modulators to change the phase or intensity of light. Accordingly, compound semiconductor materials can act to convert electrical signals carried by an elemental semiconductor material, such as silicon, to optical signals (e.g., to radiate light in light emitting devices for photonic applications), or to modulate optical signals carried by silicon. Compound semiconductor materials, such as GaAs, as well as certain elemental semiconductor materials, such as Si and Ge, can be used in light detecting devices to convert optical signals to electrical signals to detect light.

In view of these desirable properties provided by certain compound semiconductor materials, as well as by certain elemental semiconductor materials other than silicon, it would be desirable to integrate one or more of such other semiconductor materials with silicon structures to utilize the electronic properties of silicon and the desirable properties provided by the other semiconductor materials. However, it is inherently difficult to fabricate optoelectronic devices having acceptable performance characteristics by growing such compound semiconductor materials on silicon. Particularly, it is difficult to grow compound semiconductor materials on silicon over sufficiently large areas to produce integrated devices because of the significant lattice mismatch between silicon, for example, and such compound semiconductor materials. Also, because compound semiconductors are polar, while silicon is not polar, "anti-phase domain boundaries" can form in such integrated structures in which the area of the boundary between silicon and the compound semiconductor material is too large.

The inventor has determined that the problem of lattice mismatch (and also the problem of polar/non-polar characteristics) associated with growing certain semiconductor materials on each other can be at least significantly reduced by growing one semiconductor material over a very small area of a surface of another semiconductor material so that the corresponding contact area between the as-grown semiconductor material and the surface is very small. In one exemplary embodiment, one elemental semiconductor material can be grown on another lattice mismatched elemental semiconductor material. In another exemplary embodiment, a compound semiconductor material can be grown on an elemental semiconductor material. In yet another exemplary embodiment, one compound semiconductor material can be grown on another lattice mismatched compound semiconductor material.

It has been determined that such small area growth of a first semiconductor material, e.g., a compound semiconductor material, on a second semiconductor material, e.g., silicon, can be achieved by growing an initial (seed) region of the first semiconductor material with a small cross section directly on the second semiconductor material, and then allowing the cross-sectional area of the first semiconductor material to expand laterally during its continued vertical growth. In one exemplary embodiment, compound semiconductor material can be grown on silicon so as to have a limited contact area with the silicon surface to allow the flexibility for lateral expansion of the compound semiconductor material to relax stress from the lattice mismatch between the silicon and compound semiconductor material, and the ability of crystal defects including inclined dislocations or stacking faults to reach the edge of the compound semiconductor material within the seed hole so that they cannot propagate further in the vertical direction. The small growth cross-section between the different semiconductor materials can also accommodate thermal expansion mismatch. The contact area between the as-grown semiconductor material and the surface can be smaller than the area of a single domain. Consequently, in an exemplary embodiment, the problem of forming anti-phase domain boundaries between silicon and a compound semiconductor material can be simultaneously addressed by this technique.

FIG. 1 shows an exemplary embodiment of an integrated semiconductor circuit 100 including a substrate 102 having an upper surface 104. In an exemplary embodiment, the substrate 102 can be composed of an elemental semiconductor material, preferably silicon. In another exemplary embodiment, the substrate 102 can include a silicon region having the surface 104 of silicon. The substrate 102 can act to transmit electrical signals. When the substrate 102 is to be used for this purpose, the substrate 102 can be formed of single crystal or polycrystalline silicon material, at least in a surface region. The silicon can be (111) or (001)-oriented single crystal silicon, for example. Alternately, the substrate 102 can act as a light path for propagating an optical signal in an integrated circuit. For example, the substrate 102 can be composed of silicon (or include at least a silicon surface region) and the light path can be a waveguide to transmit light at the 1.55 micron communication wavelength. When the substrate 102 is used for light transmission purposes, at least a surface region of the substrate 102 is preferably composed of single crystal silicon to minimize internal light scattering. In another exemplary embodiment, polycrystalline silicon can be used to propagate light short distances if the associated losses are acceptable. In an exemplary embodiment, the substrate 102 can be a silicon region of an integrated circuit including any suitable electronic circuitry that can be fabricated in silicon.

Figure 2:
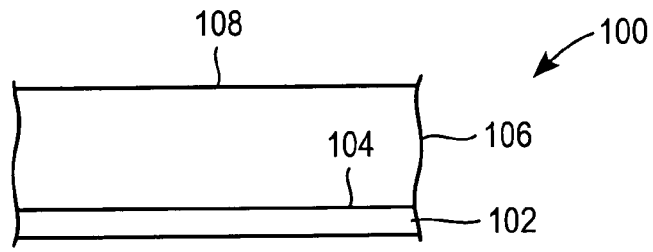
FIG. 2 illustrates an exemplary embodiment of an integrated semiconductor circuit after forming a separating material layer on the substrate shown in FIG. 1.

An exemplary embodiment of the integrated semiconductor circuit 100 shown in FIG. 2 includes a separating material layer 106 formed on the surface 104 of the substrate 102. The separating material layer 106 has an upper surface 108. The separating material layer 106 can be amorphous where it contacts the semiconductor material of the substrate 102, or it can be crystalline where it contacts the semiconductor material of the substrate 102, so long as it does not influence the crystalline growth of semiconductor material grown on the substrate 102. In an exemplary embodiment, the separating material layer 106 can be a suitable dielectric material, such as silicon dioxide. In another exemplary embodiment, the integrated semiconductor circuit 100 can include separating material layers including an intermediate etch-stop layer. The different separating material layers can have different etch rates.

Figure 3:
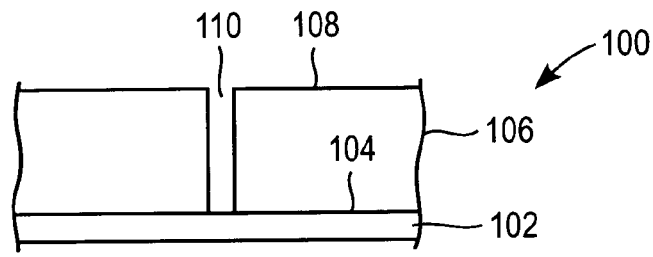
FIG. 3 illustrates an exemplary embodiment of an integrated semiconductor circuit after etching a hole in the separating material layer shown in FIG. 2.

As shown in FIG. 3, in an exemplary embodiment of the integrated semiconductor circuit 100, a through hole 110 extending to the surface 104 is formed in the separating material layer 106. The through hole can be formed by an etch process that uses any suitable etch chemistry and processing conditions that are effective to form the desired hole 110 configuration in the separating material layer 106. For example, the hole 110 can be formed with a desired shape and size using conventional lithography and reactive ion etching techniques.

Figure 4:
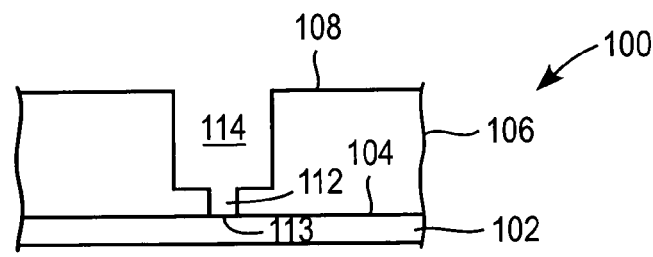
FIG. 4 illustrates an exemplary embodiment of an integrated semiconductor circuit after further etching of the separating material layer shown in FIG. 3.

As shown in FIG. 4, in the exemplary embodiment of the integrated semiconductor circuit 100, further etching of the separating material layer 106 is performed to enlarge the cross-section of the upper portion of the hole 110, resulting in an as-formed hole having a lower first portion 112 and an upper second portion 114. The second portion 114 of the hole has a larger cross-section in the direction parallel to the surface 104 than the first portion 112.

In an alternative exemplary embodiment, a larger region can be first etched part way through the upper portion of the separating material layer 106 (such as to the depth of the second portion 114 shown in FIG. 3) and then a portion of the area is etched the remainder of the way through the separating material layer 106 to reach the surface 104. It is contemplated that the etching can employ a single process in which the etch conditions are changed during the etching.

As shown in FIG. 4, the hole has a larger cross-section at the upper second portion 114, and a smaller cross-section at the lower first portion 112 where growth of a semiconductor material begins on the surface 104, as described below. The first portion 112 and the second portion 114 of the hole can have any suitable cross-sectional shape that can be produced by lithography and etch processes, such as circular, polygonal (e.g., square, rectangular, or the like), or other shapes.

In a preferred embodiment, the first portion 112 of the hole has a small width (e.g., diameter or largest lateral dimension) in a direction substantially parallel to, or parallel to, the surface 104 of the substrate 102. In exemplary embodiments, the width of the first portion 112 can be about 5 nm to about 50 nm, such as about 5 nm to about 40 nm, about 5 nm to about 30 nm, or about 5 nm to about 20 nm. As the width of the first portion 112 decreases, semiconductor materials, e.g., compound semiconductor materials, that have increased lattice mismatch with respect to the material of the surface of the substrate 104, e.g., silicon, can be used. As the lattice mismatch between the semiconductor material grown on the surface 104 and the material of the surface of the substrate 102 approaches zero, the width of the first portion 112 that can be grown with a desirable structure on the surface 104 can be increased. The first portion 112 can have a height in the vertical upward direction substantially perpendicular to, or perpendicular to, the surface 104 of the substrate 102 of about 5 nm to about 100 nm, preferably about 10 nm to about 25 nm. Decreasing the height of the first portion 112 can decrease series resistance.

The second portion 114 of the hole can have a width, which is defined in a direction substantially parallel to, or parallel to, the surface 104 of the substrate 102, of about 100 nm to about 100 microns, and a height, which is defined in the vertical upward direction substantially perpendicular to, or perpendicular to, the surface 104, of about 50 nm to about 5 microns. In this embodiment, the height of the second portion 114 is measured from the top of the first portion 112 to the upper surface 108 of the separating material layer 106. As described below, various types of devices can be built in the hole. Increasing the width (e.g., the diameter or the largest lateral dimension) of the second portion 114 can provide advantages with respect to the performance characteristics of semiconductor materials and devices built in the hole, as described below. The dimensions of the second portion 114 can be selected based on the device size to be built in the hole.

As shown in FIG. 4, in this exemplary embodiment of the integrated semiconductor circuit, the cross-sectional transition from the first portion 112 to the second portion 114 of the hole is abrupt (i.e., stepped). The depicted abrupt transition from the first portion 112 to the second portion 114 can promote light reflection in the guide region composed of at least one compound semiconductor material formed in the hole. By promoting light reflection, the amount of light that reaches the top of the hole can be enhanced. The guide region can, in effect, act as a resonator to confine the light signal so that it can be amplified. In an exemplary embodiment, a laser can be built in the guide region having an abrupt transition, such as shown in FIG. 4.

Figure 5:
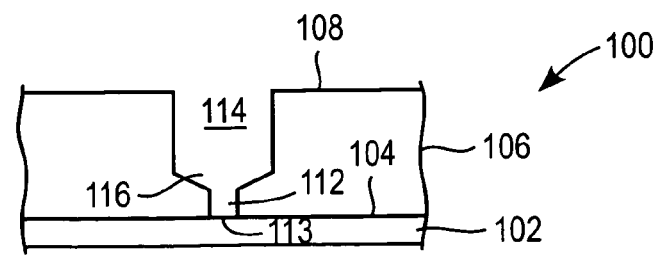
FIG. 5 illustrates another exemplary embodiment of an integrated semiconductor circuit after further etching of the separating material layer shown in FIG. 3.

As shown in FIG. 5, in another exemplary embodiment of the integrated semiconductor circuit, the hole in the separating material layer includes a third portion 116, which forms a gradual transition from the first portion 112 to the second portion 114. The third portion 116 can be formed, for example, by changing the etch process conditions after forming the hole 110 shown in FIG. 3. In contrast to the abrupt transition of the hole cross-section shown in FIG. 4, the gradual transition from the first portion 112 to the second portion 114 shown in FIG. 5 does not promote light reflection in the guide region. In an exemplary embodiment, a light emitting diode can be built in the guide region having the gradual transition.

In another exemplary embodiment, the cross-section of the hole formed in the separating material layer 106 can increase continuously in the vertical upward direction from the surface 104 of the substrate 102 to the upper surface 108 of the separating material layer 106. For example, the hole can be generally cone-shaped and have any suitable sidewall taper.

Figure 6:
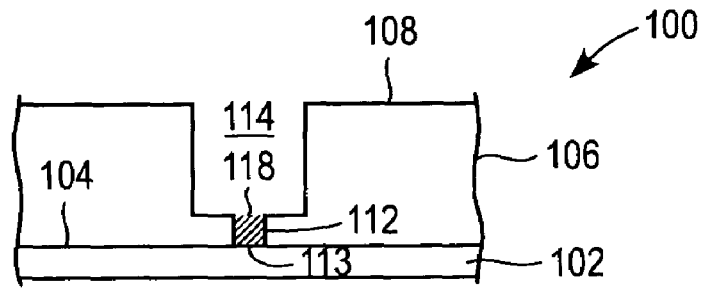
FIG. 6 illustrates an exemplary embodiment of an integrated semiconductor circuit after forming a semiconductor material in a first portion of the hole shown in FIG. 4.

FIG. 6 and FIGS. 7-9, respectively, show exemplary embodiments of the integrated semiconductor circuit 100 in which at least one semiconductor material is formed in the first portion 112 of the hole overlying the substrate 102. FIG. 6 shows a semiconductor material 118 filling the first portion 112 of the hole. The region of the surface 104 of the substrate 102 located within the first portion 112 of the hole is referred to herein as the contact region 113.

The composition of the substrate 102 and of the semiconductor material 118 can be selected based on the function of the guide region. The separating material layer 106 can be amorphous where it contacts semiconductor material formed in the different portions of the hole, or the separating material layer 106 can be crystalline where it contacts the semiconductor material so long as the crystalline structure does not influence the crystalline growth of the semiconductor material. The particular semiconductor material(s) formed in the hole of the separating material layer 106 can be selected based on the desired function of the guide region, e.g., to convert electrical energy to light energy for light emission or light modulation, to transmit a light signal introduced from the substrate 102, or to detect light. The semiconductor material can be at least one elemental semiconductor material, at least one compound semiconductor material, or a combination of elemental and compound semiconductor materials. For light emission purposes (e.g., by a light emitting diode (LED) or laser), the semiconductor material 118 formed in the hole can be a compound semiconductor material. For example, the compound semiconductor material can be at least one Group III-V material, such as at least one binary alloy selected from GaP, GaAs, InP, InN and the like; at least one ternary or quarternary Group III-V alloy, such as AlGaAs, InAsP, GaInAs, GaAlAs, GaPAs, GaAlAsSb and the like; or combinations of these or other compound semiconductor materials. For light detection purposes, the semiconductor material 118 can be any suitable elemental or compound semiconductor material, such as Si, GaAs, Ge or SiGe. The particular semiconductor material(s) used for light detection can be chosen based on the light wavelength that is to be detected. For light modulation purposes, the semiconductor material 118 can be any suitable elemental or compound semiconductor material, e.g., Si/Ge, Si/SiGe or Ge/SiGe multilayers. Accordingly, embodiments of the integrated semiconductor circuit 100 provide a desirable range of versatility with respect to the selection of component materials and function.

In exemplary embodiments, the semiconductor material 118 can be formed in the first portion of the hole by using uncatalyzed growth (selective deposition), or by a combination of catalyzed and uncatalyzed growth. The semiconductor material 118 can be formed in the first portion of the hole vertically predominately by metal catalyzed nanowire growth and laterally by uncatalyzed deposition. For semiconductor material formation without use of catalyzed growth, the semiconductor material 118 can be formed in the hole by any suitable epitaxial growth technique that allows vertical and lateral growth of the semiconductor material.

Figure 7:
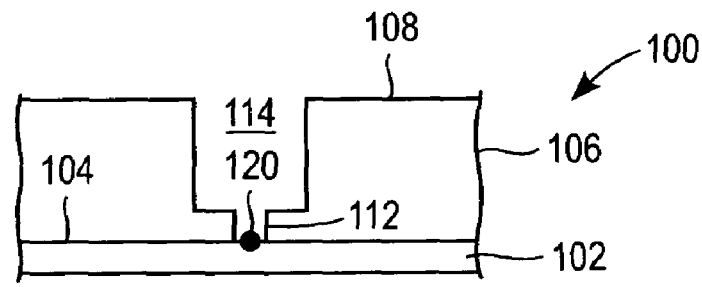
FIG. 7 illustrates an exemplary embodiment of an integrated semiconductor circuit after depositing a catalyst in the first portion of the hole shown in FIG. 4.
Figure 8:
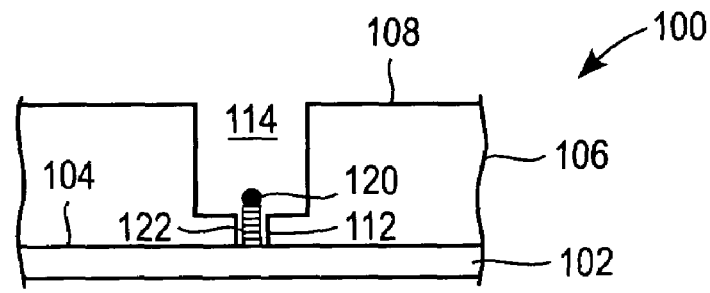
FIG. 8 illustrates an exemplary embodiment of an integrated semiconductor circuit after nanowire growth of semiconductor material in the first portion of the hole shown in FIG. 7.
Figure 9:
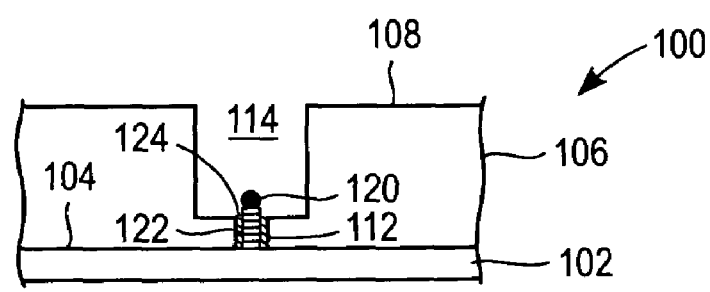
FIG. 9 illustrates an exemplary embodiment of an integrated semiconductor circuit after further nanowire growth of semiconductor material in the first portion of the hole shown in FIG. 8.
Figure 10:
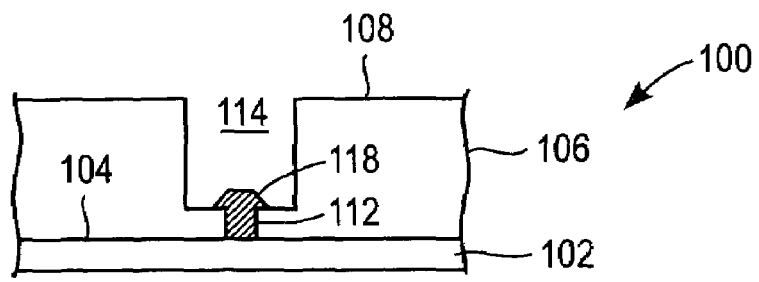
FIGS. 10-15 illustrate an exemplary embodiment of an integrated semiconductor circuit formed by continued lateral and vertical growth of semiconductor material in a second portion of the hole shown in FIG. 6.
Figure 11:
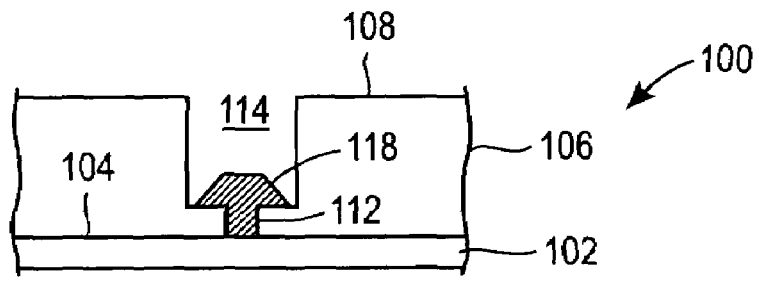
Figure 12:
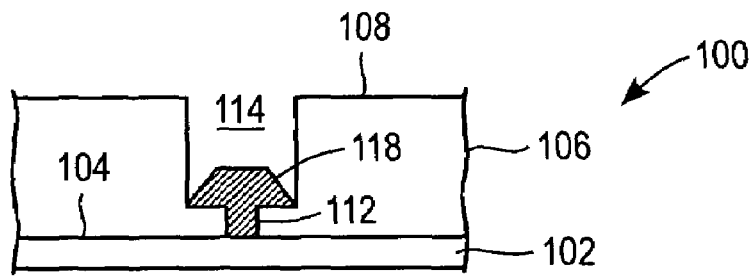
Figure 13:
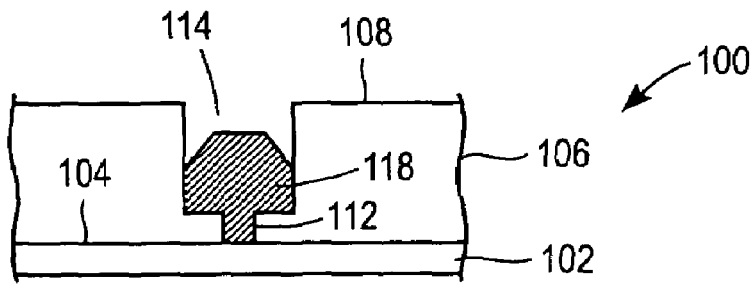
Figure 14:
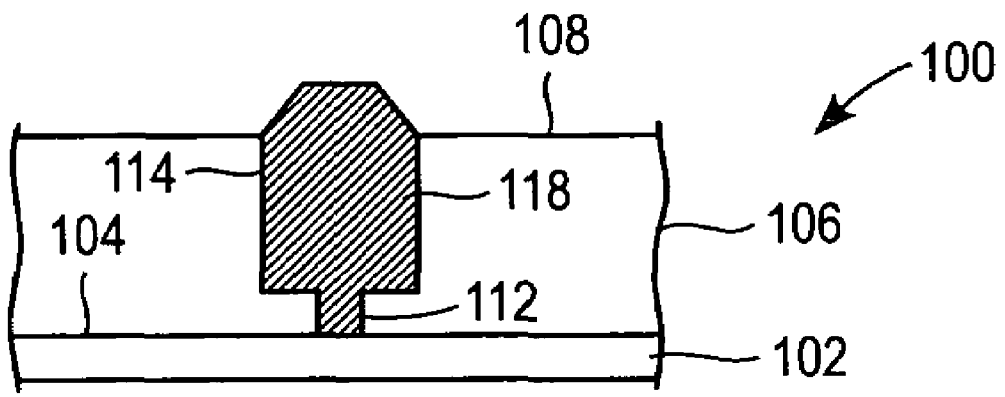
Figure 15:
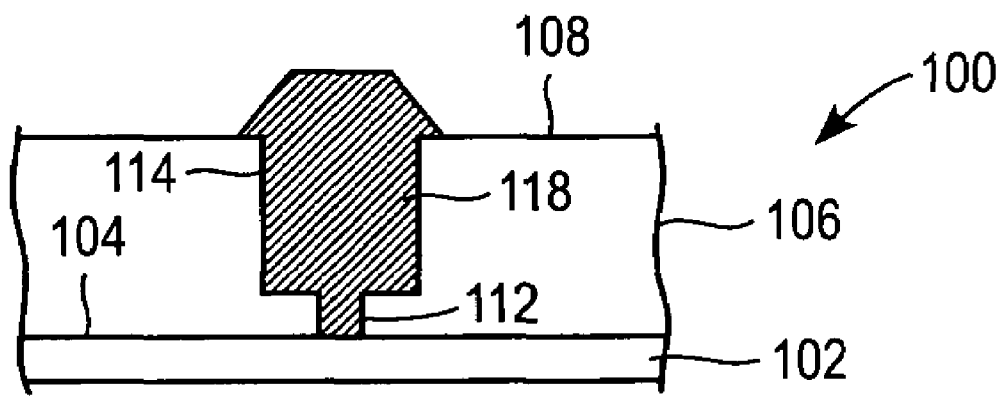

FIGS. 7-9 depict an exemplary embodiment of forming the integrated semiconductor circuit where the semiconductor material is formed in the first portion 112 of the hole in the separating material layer 106 using a combination of catalyzed growth (also referred to as nanowire growth) and uncatalyzed growth. In an exemplary embodiment, the substrate 102 is composed of silicon, the separating material layer 106 is a dielectric material, and the semiconductor material formed in the hole is at least one compound semiconductor material. The cross-section of the semiconductor material of the guide region depends primarily on the size and shape of the hole and the size of the catalyst material. The transition from the first portion 112 to the second portion 114 of the hole can be optimized for the best semiconductor growth and the desired optical or other properties of the device being formed.

As depicted in FIG. 7, a suitable catalyst material 120 is initially formed on the surface 104 of the substrate 102 within the first portion 112 of the hole. The catalyst material 120 is effective to accelerate growth of the semiconductor material in one direction. As shown in FIG. 8, in the exemplary embodiment, growth of the semiconductor material 122 is accelerated in the vertical (i.e., upward) direction. The catalyst material 120 is effective to produce more rapid vertical growth of the semiconductor material 122 at a given growth temperature, or to produce approximately the same growth rate of the semiconductor material 122 at a lower growth temperature, as compared to uncatalyzed growth of the same material. Consequently, catalyzed nanowire growth is desirable for applications where the substrate 102 on which the semiconductor material (e.g., compound semiconductor material) is formed is temperature sensitive to avoid damage to the substrate 102.

FIG. 8 shows the initial catalyzed growth of a nanowire of the compound semiconductor material 122 using the catalyst material 120. In embodiments where the nanowire formed by metal-catalyzed growth is smaller than the cross section of the first portion of the hole, as shown, the remainder of the first portion 112 of the hole can be filled by uncatalyzed lateral growth before the growing region expands to fill the wider second portion 114 of the hole.

An exemplary technique for controlling nanowire shape during catalyzed growth of nanowires on silicon substrates that can be used to control the shape of the semiconductor material formed in the first portion 112 of the hole of the separating material layer 106 is described by S. Sharma, T. I. Kamins and R. Stanley Williams, "Diameter control of Ti-catalyzed silicon nanowires," *J. Crystal Growth,* vol. 267, pp. 613-618 (2004). As described in this article, the uncatalyzed deposition rate of silicon can be inhibited by adding a gaseous species (chlorine-containing species) during the catalyzed deposition of silicon on silicon substrates, thereby producing silicon nanowires with a uniform diameter along their length. Varying the process-gas ratio allows control of the shape. Analogous combinations of precursors can be used to modify the deposition of other materials to control the lateral-to-vertical growth rates.

The growth of germanium nanowires by similar metal-catalyzed growth techniques is described by D. W. Wang and H. J. Dai, "Low-Temperature Synthesis of Single-Crystal Germanium Nanowires by Chemical Vapor Deposition," *Chem. Int Ed.,* vol. 41, pp. 4783-4786 (2002); and by T. I. Kamins, X. Li, R. Stanley Williams and X. Liu, "Growth and Structure of Chemically Vapor Deposited Ge Nanowires on Si Substrates," *Nano Lett.,* vol. 4, no. 3, pp. 503-506 (2004).

The growth of GaAs nano-whiskers on GaAs substrates by metal-catalyzed growth techniques is described by B. J. Ohlsson, M. T. Bjork, M. H. Magnusson, K. Deppert and L. Samuelson, "Size-, shape-, and position-controlled GaAs nano-whiskers," *Appl. Phys. Lett.,* vol. 79, no. 20, pp. 3335-3337 (2001). The growth of ZnO nanowires on sapphire substrates is described by M. H. Huang, S. Mao, H. Feick, H. Yan, Y. Wu, H. Kind, E. Weber, R. Russo and P. Yang, "Room-Temperature Ultraviolet Nanowire Nanolasers," *Science,* vol. 292, pp. 1897-1899 (2001). S. S. Yi, "InP Nanobridges Epitaxially Formed Between Two Vertical Si Surfaces" (unpublished), describes the epitaxial growth of InP nanowires on silicon surfaces. These techniques can be used in exemplary embodiments to form the nanowire portion of the guide region from one or more compound semiconductor materials in the hole of the separating material layer 106.

In addition to nanowires formed of a single semiconductor material, nanowire heterostructures can be formed by sequentially depositing different semiconductor materials. See, for example, M. T. Bjork, B. J. Ohlsson, T. Sass, A. I. Persson, C. Thelander, M. H. Magnusson, K. Deppert, L. R. Wallenberg and L. Samuelson, "One-dimensional Steeplechase for Electrons Realized," *Nano Lett.,* vol. 2, no. 2, pp. 87-89 (2002) (which describes forming InAs whiskers containing segments of InP). If the deposition of both semiconductor materials is catalyzed by metal nanoparticles, segments of different materials can be sequentially grown in the axial direction, thereby forming heterojunctions between the adjacent segments.

FIG. 9 shows subsequently-formed semiconductor material 124 (e.g., compound semiconductor material) filling the remainder of the first portion 112 of the hole. In the embodiment, the semiconductor material 124 is formed by uncatalyzed lateral deposition in the first portion 112 of the hole. In order to deposit the semiconductor material 124 laterally in the first portion 112 of the hole, the growth conditions are changed so that uncatalyzed, lateral growth is favored later in the process (as compared to vertical metal-catalyzed growth). Alternatively, by properly adjusting the ratio of process gases, uncatalyzed lateral growth may occur at the same time as catalyzed growth so that the entire width of the first portion 112 of the hole is filled without changing the process conditions.

After the initial, lower region (first region) of the guide region is formed in the first portion 112 of the hole, continued formation of the semiconductor material 118 (e.g., compound semiconductor material) expands to fill the larger second portion 114 of the hole to form a second region of the guide region by lateral growth as the vertical growth continues. The semiconductor material 118 can be formed in the second portion 114 of the hole vertically predominately by uncatalyzed growth and laterally by uncatalyzed growth of the second semiconductor material. The majority of the length of the guide region of semiconductor material 118 preferably has a larger cross-section than the contact region (seed region) 113 to provide efficient optical modulation, or other applications. A large cross sectional area of the second region of the guide region is also desirable to reduce series resistance.

FIGS. 10-15 show the progressive lateral and vertical filling of the second portion 114 of the hole with the semiconductor material, e.g., a compound semiconductor material, to form the second region of the guide region. The formation of the semiconductor material in the second portion 114 of the hole is preferably by uncatalyzed growth of the semiconductor material. During filling of the second portion 114 of the hole, the deposition process conditions can be changed selectively to control the shape of the deposit. The shape of the semiconductor material 118 formed in the second portion 114 of the hole can be controlled by adjusting the gaseous precursors and the deposition conditions, such as temperature, used for the deposition process.

Figure 16:
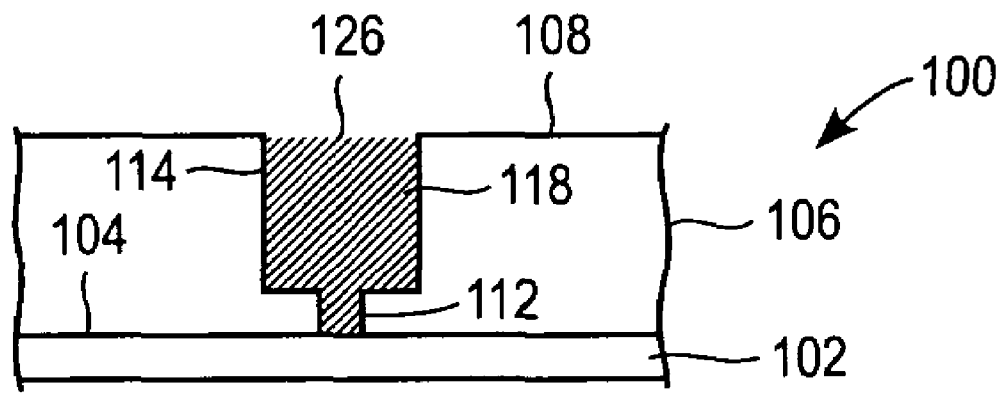
FIG. 16 illustrates an exemplary embodiment of an integrated semiconductor circuit after removing excess semiconductor material from the structure shown in FIG. 15.

As depicted in FIG. 16, excess semiconductor material 118 can be removed by any suitable technique, such as chemical mechanical polishing, to form a planar surface 126.

Figure 17:
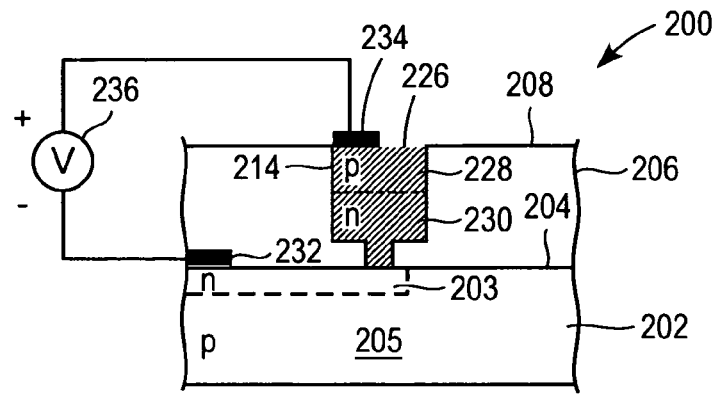
FIG. 17 illustrates an exemplary embodiment of an integrated semiconductor circuit biased for light emission.

FIG. 17 depicts an exemplary embodiment of an integrated semiconductor circuit 200 that is operable for light emission. As shown, the integrated semiconductor circuit 200 comprises a substrate 202 of a semiconductor material including a p-region and an n-region. If the substrate contact is common to all of the devices formed on the substrate 202, then the p-n junction isolation is not needed. A separating material layer 206 (e.g., dielectric material) is formed on the surface 204 of the substrate 202. The separating material layer 206 defines a through hole 214 in which semiconductor material is formed to define the guide region. In the embodiment, the semiconductor material includes an n-region 230 and an overlying p-region 228. Electrical contacts 232 and 234 are electrically connected to a voltage source 236, which is operable to bias the structure to produce light emission from the guide region. An electrical signal is introduced into the guide region and converted to light energy. As discussed above, the abrupt transition of the guide region of the depicted exemplary embodiment can promote light reflection.

Figure 18:
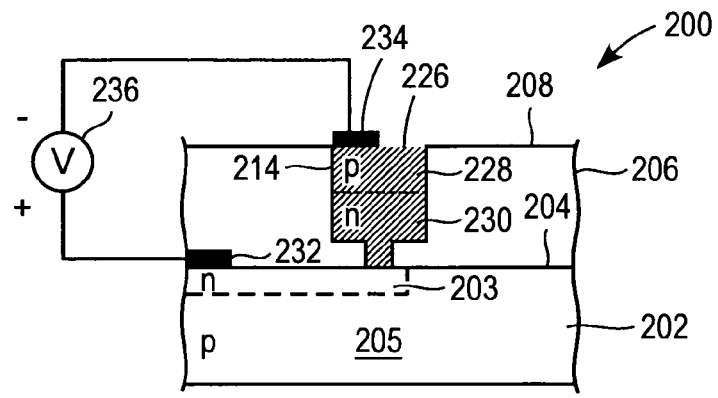
FIG. 18 illustrates an exemplary embodiment of an integrated semiconductor circuit biased for light detection.

FIG. 18 depicts another exemplary embodiment of the integrated semiconductor circuit 200 that is operable for light detection. As shown, the voltage source 236 is operable to bias the structure so that an optical signal introduced into the guide region can be detected by the semiconductor material forming the guide region.

Figure 19:
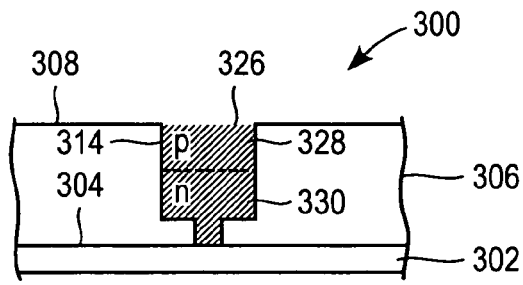
FIG. 19 illustrates an exemplary embodiment of an integrated semiconductor circuit suitable for light modulation.

FIG. 19 depicts an exemplary embodiment of an integrated semiconductor circuit 300 that is operable to modulate an optical signal introduced into the guide region. As shown, the integrated semiconductor circuit 300 comprises a substrate 302 of a suitable material, e.g., silicon. The substrate 302 can optionally include an isolation region, such as shown in FIGS. 17 and 18. A separating material layer 306 of a suitable material, e.g., dielectric material, is formed on the surface 304 of the substrate 302. The separating material layer 306 includes a hole 314 in which semiconductor material is formed to define the guide region. The semiconductor material includes an n-region 330 and an overlying p-region 328.

Figure 20:
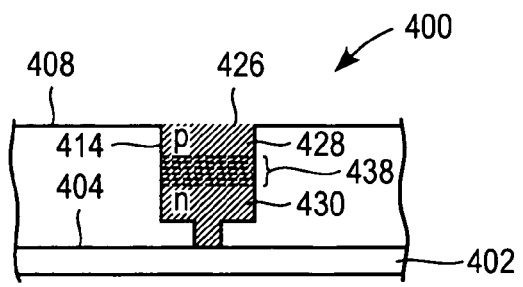
FIG. 20 illustrates another exemplary embodiment of an integrated semiconductor circuit suitable for light modulation.

FIG. 20 depicts another exemplary embodiment of an integrated semiconductor circuit 400 that is operable for light modulation. As shown, the integrated semiconductor circuit 400 comprises a substrate 402 and a separating material layer 406 formed on the surface 404 of the substrate 402. The substrate 402 can optionally include an isolation region, such as shown in FIGS. 17 and 18. The separating material layer 406 defines a hole 414 in which semiconductor material is formed to define the guide region. The semiconductor material includes an n-region 430 and a p-region 428. Heteroepitaxial layers 438 having different compositions are formed between the uniform p-region 428 and uniform n-region 430. In the structure, the location of the p-n junction can vary depending on the particular device built in the guide region.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. An integrated semiconductor circuit, comprising:
   a substrate having a surface of a first semiconductor material;
   at least one separating material layer formed on the surface of the substrate, the at least one separating material layer defining a through hole extending to the surface; and
   a guide region comprising at least one second semiconductor material, the guide region including at least a first region formed in a first portion of the hole and a second region formed in a second portion of the hole, the first region contacting the surface of the substrate over a contact region having a maximum width of about 5 nm to about 50 nm, and the second region having a larger cross-section than the first region.

2. The integrated semiconductor circuit of claim 1, wherein the at least one separating material is amorphous where the separating material contacts the first semiconductor material and/or the second semiconductor material.

3. The integrated semiconductor circuit of claim 1, wherein the first region of the guide region has a height of about 5 nm to about 100 nm, and the second region of the guide region has a width of about 100 nm to about 100 microns and a height of about 100 nm to about 5 microns.

4. The integrated semiconductor circuit of claim 1, wherein the first semiconductor material is single crystal silicon.

5. The integrated semiconductor circuit of claim 1, wherein the second semiconductor material is at least one elemental semiconductor material and/or at least one compound semiconductor material.

6. The integrated semiconductor circuit of claim 1, wherein the guide region is operable to modulate a light signal introduced into the guide region.

7. The integrated semiconductor circuit of claim 1, wherein the guide region is operable to convert an electrical signal introduced into the guide region.

8. The integrated semiconductor circuit of claim 1, which comprises a light emitting device formed in the guide region.

9. The integrated semiconductor circuit of claim 8, wherein the guide region has a stepped transition in cross-section from the first region to the second region such that the guide region can reflect light.

10. The integrated semiconductor circuit of claim 1, wherein the guide region comprises a third region between the first and second regions, the third region has a cross-section which increases in size in a height direction of the guide region from the first region to the second region.

11. The integrated semiconductor circuit of claim 1, which comprises a light detecting device formed in the guide region.

12. A method of converting an electrical signal to an optical signal, comprising:
   introducing an electrical signal into the guide region of the integrated semiconductor circuit according to claim 1; and
   converting the electrical signal to an optical signal.

13. A method of detecting light, comprising:
introducing an optical signal into the guide region of the integrated semiconductor circuit according to claim 1; and
converting the optical signal to an electrical signal.

14. A method of making an integrated semiconductor circuit, comprising:
forming at least one separating material layer on a surface of a substrate, the surface being of a first semiconductor material;
forming a through hole in the at least one separating material layer extending to the surface of the substrate, the hole including at least a first portion overlying the surface and a second portion having a larger cross-section than the first portion; and
forming at least one second semiconductor material in the hole to form a guide region, the guide region including a first region in the first portion of the hole and a second region in the second portion of the hole, the first region contacting the surface of the substrate over a contact region having a maximum width of about 5 nm to about 50 nm, and the second region having a larger cross-section than the first region.

15. The method of claim 14, wherein the separating material is amorphous where the separating material contacts the first semiconductor material and/or the second semiconductor material.

16. The method of claim 14, wherein the first region of the guide region has a height of about 5 nm to about 100 nm, and the second region of the guide region has a width of about 100 nm to about 100 microns and a height of about 100 nm to about 5 microns.

17. The method of claim 14, wherein the first semiconductor material is single crystal silicon.

18. The method of claim 14, wherein the second semiconductor material is at least one elemental semiconductor material and/or at least one compound semiconductor material.

19. The method of claim 14, wherein:
the first region of the guide region is formed in the first portion of the hole vertically predominately by metal catalyzed nanowire growth and laterally by uncatalyzed deposition of the second semiconductor material; and
the second region of the guide region is formed in the second portion of the hole vertically predominately by uncatalyzed growth and laterally by uncatalyzed growth of the second semiconductor material.

20. The method of claim 14, wherein the first and second regions of the guide region are formed in the first and second portions of the hole using uncatalyzed epitaxial growth of the second semiconductor material.

21. The method of claim 14, wherein the guide region has a stepped transition in cross-section from the first region to the second region.

22. The method of claim 21, further comprising:
forming a third portion of the hole between the first and second portions of the hole, the third portion having a cross-section which increases in size in a height direction of the guide region from the first portion to the second portion; and
forming the second semiconductor material in the third portion of the hole to form a third region of the guide region.

* * * * *